United States Patent
Wang et al.

(10) Patent No.: US 11,362,291 B2
(45) Date of Patent: Jun. 14, 2022

(54) FLEXIBLE SUBSTRATE, METHOD FOR MANUFACTURING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yanxin Wang, Beijing (CN); Zhifeng Zhan, Beijing (CN); Peng Huang, Beijing (CN); Wei Wang, Beijing (CN); Shuquan Yang, Beijing (CN); Jiafan Shi, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 118 days.

(21) Appl. No.: 16/648,676

(22) PCT Filed: Apr. 26, 2019

(86) PCT No.: PCT/CN2019/084414
§ 371 (c)(1),
(2) Date: Mar. 19, 2020

(87) PCT Pub. No.: WO2019/206245
PCT Pub. Date: Oct. 31, 2019

(65) Prior Publication Data
US 2020/0266367 A1  Aug. 20, 2020

(30) Foreign Application Priority Data
Apr. 28, 2018  (CN) .......................... 201810405080.7

(51) Int. Cl.
*H01L 51/00* (2006.01)
*G09F 9/30* (2006.01)

(52) U.S. Cl.
CPC .......... *H01L 51/0097* (2013.01); *G09F 9/301* (2013.01)

(58) Field of Classification Search
CPC ..... H01L 51/0097; H01L 51/56; H01L 27/32; G09F 9/301; Y02P 70/50; Y02E 10/549
See application file for complete search history.

(56) References Cited

U.S. PATENT DOCUMENTS

2016/0211482 A1* 7/2016 Namkung ........... H01L 51/5246
2019/0088902 A1    3/2019 Wang et al.
(Continued)

FOREIGN PATENT DOCUMENTS

CN    106328003    1/2017
CN    106652802    5/2017
(Continued)

OTHER PUBLICATIONS

Office action from Chinese Application No. 201810405080.7 dated Jun. 3, 2019.
(Continued)

*Primary Examiner* — Kyoung Lee
(74) *Attorney, Agent, or Firm* — Calfee, Halter & Griswold LLP

(57) ABSTRACT

A flexible substrate including a flexible base substrate, and a wiring layer and a back film on opposite sides of the flexible base substrate respectively. A side of the flexible base substrate facing away from the wiring layer is provided with a flat area including the back film and a bending area from which the back film is removed, the bending area is provided with an elastic reinforced film, and an elastic modulus of the elastic reinforced film is smaller than an
(Continued)

elastic modulus of the back film. A display device including the flexible substrate and a method for manufacturing the flexible substrate are also provided.

19 Claims, 4 Drawing Sheets

(56) References Cited

U.S. PATENT DOCUMENTS

2019/0311657 A1  10/2019  Wang et al.
2020/0203396 A1   6/2020  Liu
2020/0266367 A1   8/2020  Wang et al.

FOREIGN PATENT DOCUMENTS

| CN | 106653777 | 5/2017 |
|----|-----------|--------|
| CN | 206210301 | 5/2017 |
| CN | 106910428 | 6/2017 |
| CN | 106952930 | 7/2017 |
| CN | 107068695 | 8/2017 |
| CN | 107230429 | 10/2017 |
| CN | 107565018 | 1/2018 |
| CN | 107742639 | 2/2018 |
| CN | 108597378 | 9/2018 |
| JP | 2003-133676 | 5/2003 |
| JP | 206163492 | 5/2017 |

OTHER PUBLICATIONS

Office action from Chinese Application No. 201810405080.7 dated Dec. 12, 2019.
Office action from Chinese Application No. 201810405080.7 dated Mar. 3, 2020.
International Search Report and Written Opinion from PCT/CN2019/084414 dated Jul. 30, 2019.

* cited by examiner

PRIOR ART

FLEXIBLE SUBSTRATE, METHOD FOR MANUFACTURING THE SAME AND DISPLAY DEVICE

RELATED APPLICATION

The present application is a 35 U.S.C. 371 national stage application of PCT International Application No. PCT/CN2019/084414, filed on Apr. 26, 2019, which claims the benefit of Chinese Patent Application No. 201810405080.7, filed on Apr. 28, 2018, the entire disclosures of which are incorporated herein by reference.

TECHNICAL FIELD

Embodiments of the present disclosure relate to the field of display technologies, and in particular to a flexible substrate, a method for manufacturing the flexible substrate and a display device.

BACKGROUND

With the continuous development of technology, consumers' demands for display devices such as mobile phones and tablet computers have become more diverse, such as thin and light, narrow frames, or ultra-narrow frames.

SUMMARY

An exemplary embodiment of the present disclosure provides a flexible substrate comprising a flexible base substrate, and a wiring layer and a back film on opposite sides of the flexible base substrate respectively. A side of the flexible base substrate facing away from the wiring layer is provided with a flat area comprising the back film and a bending area from which the back film is removed, the bending area is provided with an elastic reinforced film, and an elastic modulus of the elastic reinforced film is smaller than an elastic modulus of the back film.

According to some exemplary embodiments of the present disclosure, the elastic reinforced film comprises a light-curing adhesive film.

According to some exemplary embodiments of the present disclosure, the back film in the flat area is in direct contact with a surface of the flexible base substrate facing away from the wiring layer.

According to some exemplary embodiments of the present disclosure, the back film in the flat area is adhered to the flexible base substrate through an adhesive layer.

According to some exemplary embodiments of the present disclosure, the elastic reinforced film is in direct contact with a surface of the flexible base substrate facing away from the wiring layer, and the elastic modulus of the elastic reinforced film is smaller than an elastic modulus of the adhesive layer.

According to some exemplary embodiments of the present disclosure, the elastic reinforced film is adhered to the flexible base substrate through the adhesive layer.

According to some exemplary embodiments of the present disclosure, the adhesive layer comprises a pressure-sensitive adhesive layer.

According to some exemplary embodiments of the present disclosure, a thickness of the elastic reinforced film satisfies one of the following conditions: the thickness of the elastic reinforced film is less than or equal to 30 μm±5 μm; the thickness of the elastic reinforced film is less than or equal to a thickness of the adhesive layer; the thickness of the elastic reinforced film is less than a thickness of the back film; and the thickness of the elastic reinforced film is less than a sum of the thickness of the back film and the thickness of the adhesive layer.

According to some exemplary embodiments of the present disclosure, the flexible substrate further comprises a flexible encapsulation layer on a side of the wiring layer facing away from the flexible base substrate.

According to some exemplary embodiments of the present disclosure, a surface of the elastic reinforced film facing away from the flexible base substrate comprises a concave-convex shape.

According to some exemplary embodiments of the present disclosure, a concave direction or a convex direction of the concave-convex shape on the surface of the elastic reinforced film facing away from the flexible base substrate is conformal with a bending direction of the flexible substrate.

According to some exemplary embodiments of the present disclosure, the surface of the elastic reinforced film facing away from the flexible base substrate is symmetrically arranged with a bending center of the bending area as a symmetrical center.

According to some exemplary embodiments of the present disclosure, a portion of the surface of the elastic reinforced film facing away from the flexible base substrate at a bending center of the bending area comprises a concave shape.

Another exemplary embodiment of the present disclosure provides a display device comprising any one of the above-mentioned flexible substrates.

Yet another exemplary embodiment of the present disclosure provides a method for manufacturing a flexible substrate, comprising: providing a flexible base substrate; forming a wiring layer on a side of the flexible base substrate; forming a back film on a side of the flexible base substrate facing away from the wiring layer; removing a portion of the back film in a bending area of the side of the flexible base substrate facing away from the wiring layer; and forming an elastic reinforced film in the bending area, and an elastic modulus of the elastic reinforced film being smaller than an elastic modulus of the back film.

According to some exemplary embodiments of the present disclosure, the removing a portion of the back film in a bending area of the side of the flexible base substrate facing away from the wiring layer comprises removing a portion of the back film in the bending area of the side of the flexible base substrate facing away from the wiring layer with laser light.

According to some exemplary embodiments of the present disclosure, the forming a back film on a side of the flexible base substrate facing away from the wiring layer comprises: sequentially stacking an adhesive layer and the back film on a surface of the flexible base substrate facing away from the wiring layer. The removing a portion of the back film in a bending area of the side of the flexible base substrate facing away from the wiring layer comprises: removing portions of the back film and the adhesive layer in the bending area together.

According to some exemplary embodiments of the present disclosure, the elastic reinforced film is made of light-curing adhesive. The forming an elastic reinforced film in the bending area comprises: making a surface of the formed elastic reinforced film facing away from the flexible base substrate comprise a concave-convex shape by adjusting a coating size, times of coating and a curing time after the coating of the light-curing adhesive.

According to some exemplary embodiments of the present disclosure, the adhesive layer is made of a pressure-sensitive adhesive.

According to some exemplary embodiments of the present disclosure, the method further comprises forming a flexible encapsulation layer on a side of the wiring layer facing away from the flexible base substrate.

BRIEF DESCRIPTION OF THE DRAWINGS

The drawings described herein are used to provide a further understanding of the embodiments of the present disclosure and constitute a part of the embodiments of the present disclosure. The schematic embodiments of the present disclosure and the descriptions thereof are used to explain the embodiments of the present disclosure and do not constitute improper limitation to the disclosure. In the drawings:

FIG. 8 is a schematic diagram of manufacturing the flexible substrate shown in FIG. 3a.

DETAILED DESCRIPTION OF THE DISCLOSURE

In order to further explain the flexible substrate, the manufacturing method thereof and the display device provided by the embodiments of the present disclosure, a detailed description is made below with reference to the accompanying drawings.

In order to realize a narrow frame or an ultra-narrow frame of a display device, a flexible substrate is provided in the display device. By taking advantage of the flexibility of the flexible substrate, the end of the flexible substrate connected to the external circuit may be bent toward the back surface of the flexible substrate so as to reduce the package size of the flexible substrate, thereby reducing the frame size of the display device.

However, the back surface of the flexible substrate is provided with a back film for blocking water and oxygen. When the end of the flexible substrate is bent toward the back surface of the flexible substrate, the portion of the back film in the bending area of the flexible substrate will generate a large bending stress, resulting in a disconnection possibility of the metal wires inside the flexible substrate under the bending stress of the back film.

When a back film is provided on a flexible substrate, in order to facilitate production, the entire back surface of the flexible substrate is covered with the back film. The back film is made of materials such as polyethylene terephthalate (PET), so that the back film is relatively hard and the flexibility of the back film is relatively poor. As a result, the back film is prone to generate a large bending stress when it is bent, causing damage to the metal wires inside the flexible substrate and causing the metal wires to be broken.

Figure 1:
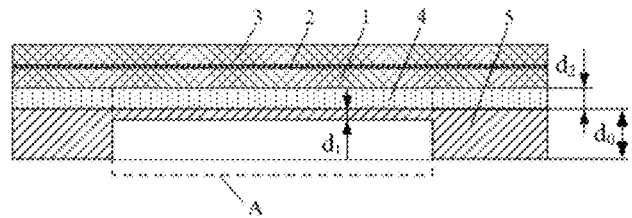
FIG. 1 is a schematic structural diagram of a typical flexible substrate.
Figure 2:
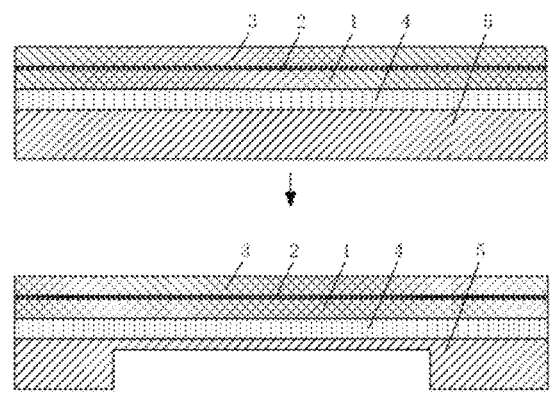
FIG. 2 is a flowchart of manufacturing the flexible substrate shown in FIG. 1.

FIG. 1 illustrates a schematic structural diagram of a typical flexible substrate. As shown in FIG. 1, the flexible substrate comprises a flexible base substrate 1, a wiring layer 2 and a back film 5 provided on opposite sides of the flexible base substrate 1 respectively. The back film 5 is provided on the flexible base substrate 1 through an adhesive layer 4, and a flexible encapsulation layer 3 is provided on a side of the wiring layer 2 facing away from the flexible base substrate 1. In order to reduce the stress required to be sustained by metal wires inside the flexible substrate, as shown in FIG. 1 and FIG. 2, a bending stress of the back film 5 in a bending area A can be reduced by reducing a thickness of a portion of the back film 5 in the bending area A. Specifically, the back film 5 has a reduced thickness $d_1$ in the bending area A, and has a thickness $d_0$ outside the bending area A, where $d_1<d_0$, and the adhesive layer 4 has a thickness $d_2$. In this way, the thinned back film 5 in the bending area A can not only block water and oxygen, but also moderately reduce the stress required to be sustained by the metal wires of the wiring layer 2 in the flexible substrate. However, the bending stress generated during the bending of the thinned back film 5 in the bending area A may still cause the metal wires of the wiring layer 2 in the flexible substrate to be broken, so there is still a great risk of disconnection of metal wires in this solution.

Figure 3A:
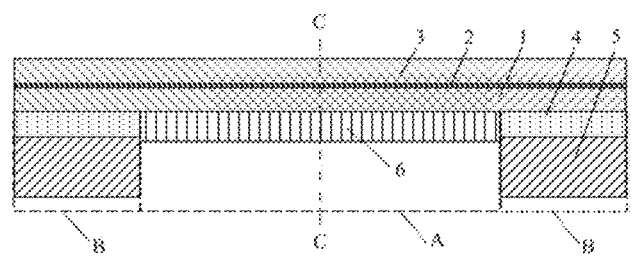
FIG. 3a is a schematic structural diagram of a flexible substrate according to an embodiment of the present disclosure.
Figure 4:
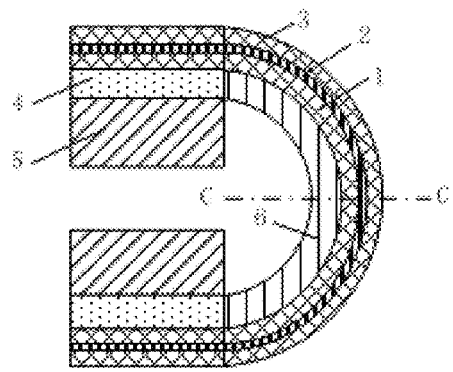
FIG. 4 is a schematic structural diagram of the flexible substrate shown in FIG. 3a in a bent state.

In view of this, an embodiment of the present disclosure provides a flexible substrate, as shown in FIGS. 3a and 4. The flexible substrate comprises a flexible base substrate 1, and a wiring layer 2 and a back film 5 provided on opposite sides of the flexible base substrate 1 respectively. A side of the flexible base substrate 1 facing away from the wiring layer 2 is provided with a flat area B in which the back film 5 is retained and a bending area A in which the back film 5 is removed. The bending area A is provided with an elastic reinforced film 6, and an elastic modulus of the elastic reinforced film 6 is smaller than an elastic modulus of the back film 5.

As used herein, the term "bending area" refers to an area of a flexible substrate that is deformed from a flat shape to a bending shape when being bent, as shown in FIG. 4, for example. Accordingly, the term "flat area" refers to an area of a flexible substrate that still maintains a flat shape without being deformed when being bent.

The above-mentioned wiring layer 2 is provided on a side of the flexible base substrate 1. For example, the wiring layer 2 is provided on a surface of a side of the flexible base substrate 1. The wiring layer 2 is generally provided with a plurality of conductive wires for transmitting signals. A side of the wiring layer 2 facing away from the flexible base substrate 1 may be provided with a flexible encapsulation layer 3, to perform insulation protection and water-oxygen blocking on the conductive wires in the wiring layer 2. The flexible encapsulation layer 3 may be generally formed by using an organic material such as polyimide, polycarbonate, polyetherimide, or polyethersulfone.

In an exemplary embodiment, the above-mentioned elastic reinforced film 6 may be formed of a light-curing adhesive, for example, an ultraviolet (UV) light-curing adhesive, to facilitate production.

In the flexible substrate provided by an embodiment of the present disclosure, a portion of the back film 5 in the bending area A is removed, and the elastic reinforced film 6 is provided in the bending area A to replace the portion of back film 5 previous in the bending area A. In this way, when the flexible substrate is bent toward the back surface of the flexible substrate, since the elastic modulus of the elastic reinforced film 6 is smaller than the elastic modulus of the back film 5, that is, the elastic reinforced film 6 has better flexibility compared with the back film 5, the bending stress generated by the elastic reinforced film 6 during bending is smaller. Accordingly, the bending stress that the conductive wires in the wiring layer 2 in the flexible substrate need to share is also smaller, and hence the problem of disconnection for the conductive wires can be effectively avoided, thereby reducing the risk of disconnection of the conductive wires in the wiring layer 2 in the flexible substrate when the flexible substrate is bent.

In addition, in the flexible substrate provided in an embodiment of the present disclosure, an elastic reinforced film 6 made of, for example, a light-curing adhesive is provided in the bending area A from which the back film 5 is removed, which is not only convenient to manufacture, but also can be used to encapsulate the portion of the flexible base substrate 1 that is not protected by the back film 5 to comprehensively and well block water and oxygen from the flexible base substrate 1, thereby ensuring the reliability of the flexible substrate and the reliable use of the flexible substrate.

In an exemplary embodiment, as shown in FIGS. 3a and 4, the back film 5 in the flat area B may be adhered to the flexible base substrate 1 through an adhesive layer 4. When the back film 5 is provided on the side of the flexible base substrate 1 facing away from the wiring layer 2, the adhesive layer 4 and the back film 5 may be sequentially stacked on the surface of the flexible base substrate 1 facing away from the wiring layer 2. When removing the portion of the back film 5 in the bending area A, the portion of the adhesive layer 4 in the bending area A may be removed together. Therefore, the elastic reinforced film 6 can be in direct contact with the surface of the flexible base substrate 1 facing away from the wiring layer 2. Of course, in this case, the elastic modulus of the elastic reinforced film 6 should also be smaller than an elastic modulus of the adhesive layer 4, to ensure that the bending stress of the elastic reinforced film 6 due to being bent is smaller after replacing the portion of the adhesive layer 4 in the bending area A with the elastic reinforced film 6, thereby further reducing the stress that the conductive wires in the wiring layer 2 need to share, so as to further reduce the risk of disconnection of the conductive wires in the wiring layer 2 when the flexible substrate is bent.

Figure 3B:
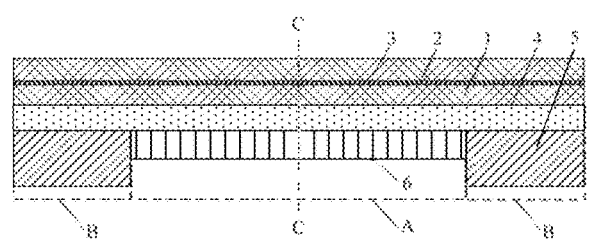
FIG. 3b is a schematic structural diagram of a flexible substrate according to an embodiment of the present disclosure.

Alternatively, as shown in FIG. 3b, in another embodiment of the present disclosure, instead of removing the portion of the adhesive layer 4 in the bending area A, the elastic reinforced film 6 may be disposed on a surface of the adhesive layer 4 facing away from the flexible base substrate 1 in the bending area A. In this case, although the adhesive layer 4 still exists in the bending area A, the bending stress generated by the elastic reinforced film 6 during bending is relatively small since the elastic modulus of the elastic reinforced film 6 is smaller than the elastic modulus of the back film 5. Therefore, the bending stress that the conductive wires in the wiring layer 2 in the flexible substrate need to share may be still small, so as to effectively avoid the problem of disconnection of the conductive wires.

In an exemplary embodiment, the adhesive layer 4 may be made of a pressure-sensitive adhesive to facilitate fabrication.

It can be understood that a thickness of the elastic reinforced film 6 may be set according to actual needs. Particularly, compared with the flexible substrate shown in FIG. 1, in an embodiment according to the present disclosure, the thickness of the elastic reinforced film 6 may not exceed a sum of a thickness $d_2$ of the adhesive layer 4 and a thickness $d_1$ of the thinned back film 5. For example, assuming that the thickness $d_0$ of the back film 5 is 75 μm, the thickness $d_1$ of the thinned back film 5 is 5 μm, and the thickness $d_2$ of the adhesive layer 4 is 25 μm, then the thickness of the elastic reinforced film 6 is less than or equal to $d_1+d_2$. Of course, the thickness value of the elastic reinforced film 6 is not limited to this. For example, the thickness of the elastic reinforced film 6 is less than or equal to 30 μm±5 μm. Alternatively, the thickness of the elastic reinforced film 6 is less than or equal to the thickness of the adhesive layer 4. Alternatively, the thickness of the elastic reinforced film 6 is less than the thickness of the back film 5. Or alternatively, the thickness of the elastic reinforced film 6 is less than a sum of the thicknesses of the back film 5 and the adhesive layer 4, and the like.

Figure 5A:
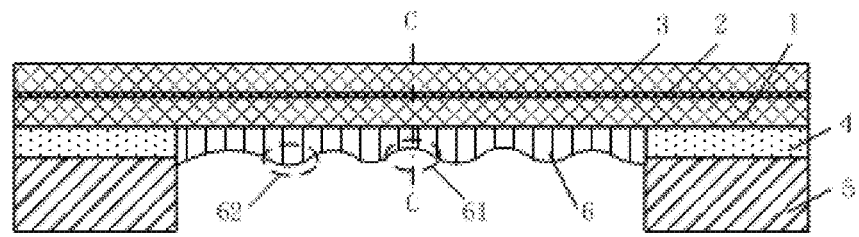
FIGS. 5a, 5b, and 5c are schematic structural diagrams of a flexible substrate according to an embodiment of the present disclosure.
Figure 5B:
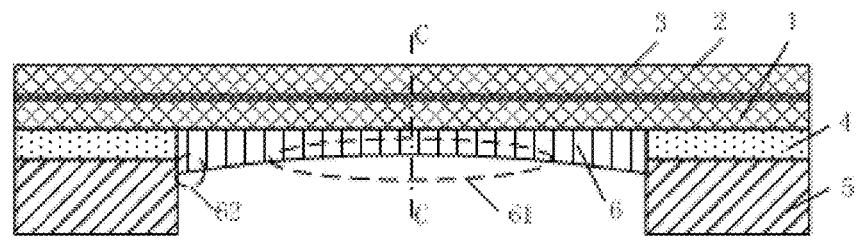
Figure 5C:
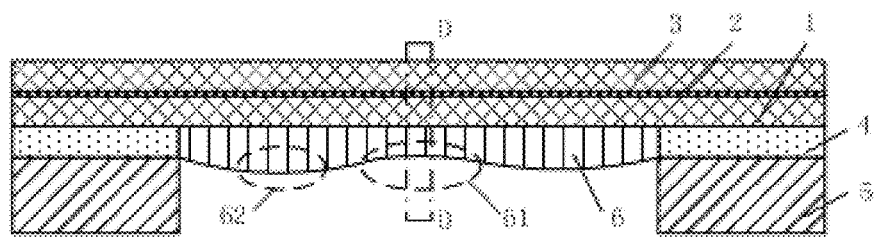

In an exemplary embodiment, the surface of the elastic reinforced film 6 facing away from the flexible base substrate 1 may be flat or may have a concave-convex shape, such as a wavy surface shown in FIG. 5a and FIG. 5c, or a concave curved surface shown in FIG. 5b. There may be various implementations of the morphology of the concave-convex arrangement, and a person skilled in the art may set it according to actual needs. In an exemplary embodiment, a concave direction or a convex direction of the concave-convex shape on the surface of the elastic reinforced film 6 facing away from the flexible base substrate 1 may be the same as or conformal with a bending direction of the flexible substrate.

In the flexible substrate provided in this embodiment, the surface of the elastic reinforced film 6 facing away from the flexible base substrate 1 is set as a concave-convex surface, which helps to improve the flexibility of the elastic reinforced film 6. When the flexible substrate is bent toward the back surface of the flexible substrate, the concave-convex surface of the elastic reinforced film 6 is used to further alleviate the stress on the conductive wires in the wiring layer 2 due to bending the elastic reinforced film 6, thereby more effectively reducing the risk of disconnection of the conductive wires in the wiring layer 2.

As shown in FIGS. 5a, 5b, and 5c, the elastic reinforced film 6 is disposed on the flexible base substrate 1, and thus the surface of the elastic reinforced film 6 facing the flexible base substrate 1 is a flat surface. In the case where the surface of the elastic reinforced film 6 facing away from the flexible base substrate 1 is set as a concave-convex surface, the surface of the elastic reinforced film 6 facing away from the flexible base substrate 1 will have concave portions 61 and convex portions 62 respectively. In order to effectively improve the bending performance of the flexible substrate, the portion at the bending center of the bending area A of the surface of the elastic reinforced film 6 facing away from the flexible base substrate 1 may be set in a concave shape, that is, at least one of the concave portions 61 of the elastic reinforced film 6 is at the bending center of the bending area A. Therefore, when the flexible substrate is bent toward the back surface of the flexible substrate, the portion with the greatest degree of bending of the elastic reinforced film 6 is the concave portion 61 at the bending center of the bending area A. Since the thickness of the concave portion 61 of the elastic reinforced film 6 is small, the maximum bending stress of the elastic reinforced film 6 due to bending can be reduced, thereby effectively improving the bending performance of the flexible substrate.

It should be noted that the bending center of the bending area A may exist in the form of a flat surface, such as the C-C plane shown in FIGS. 5*a* and 5*b*, or may exist in the form of a space body, such as the D-D space area shown in FIG. 5*c*.

Further, in an exemplary embodiment, as shown in FIG. 5*b* and FIG. 5*c*, the surface of the elastic reinforced film 6 facing away from the flexible base substrate 1 may be symmetrically arranged with the bending center of the bending area A as a symmetrical center in order to realize a symmetrical bending of the elastic reinforced film 6, which allows the bending stress generated by the elastic reinforced film 6 when being bent to be symmetrically distributed, thereby ensuring that the stress on the conductive wires in the wiring layer 2 in the flexible substrate is relatively uniform, which helps to improve bending stability of the flexible substrate.

For example, referring to FIG. 5*b*, in the flexible substrate provided in this embodiment, the surface of the elastic reinforced film 6 facing away from the flexible base substrate 1 is symmetrically arranged with the bending center plane C-C of the bending area A as a symmetrical center plane, and at least one concave portion 61 of the elastic reinforced film 6 is penetrated by the symmetrical center plane. When the flexible substrate is bent toward the back surface of the flexible substrate, the portion where the elastic reinforced film 6 is most bent is the concave portion 61 penetrated by the symmetrical center plane C-C. Since the thickness of the concave portion 61 is small, the maximum bending stress of the elastic reinforced film 6 due to bending is reduced. Moreover, since the surface of the elastic reinforced film 6 facing away from the flexible base substrate 1 is symmetrically arranged, the bending stress generated by the elastic reinforced film 6 when it is bent is symmetrically distributed, thereby ensuring that the stress on the conductive wires in the wiring layer 2 in the flexible substrate is uniformly distributed, in order to effectively improve the bending performance and bending stability of the flexible substrate.

The embodiment of the present disclosure also provides a method for manufacturing a flexible substrate, which is used for manufacturing the flexible substrate provided by the above embodiments.

Figure 6:
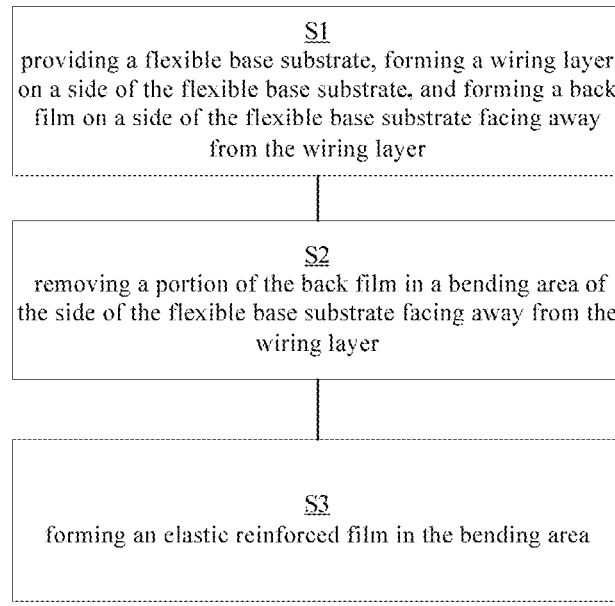
FIG. 6 is a flowchart of a method for manufacturing a flexible substrate according to an embodiment of the present disclosure.

As shown in FIG. 6, at step S1, a flexible base substrate 1 is provided, a wiring layer 2 is formed on a side of the flexible base substrate 1, and a back film 5 is formed on a side of the flexible base substrate 1 facing away from the wiring layer 2.

Forming the wiring layer 2 on a side of the flexible base substrate 1 may be, for example, forming the wiring layer 2 on a surface of a side of the flexible base substrate 1. The wiring layer 2 is generally provided with a plurality of conductive wires for transmitting signals. On a side of the wiring layer 2 facing away from the flexible base substrate 1, a flexible encapsulation layer 3 may be fabricated, so as to perform insulation protection and water-oxygen block on the conductive wires in the wiring layer 2. The flexible encapsulation layer 3 may be generally formed by using an organic material such as polyimide, polycarbonate, polyetherimide, or polyethersulfone.

At step S2, a portion of the back film 5 in a bending area A of the side of the flexible base substrate 1 facing away from the wiring layer 2 is removed. For example, a laser light removal method may be used to remove a portion of the back film 5 in the bending area A.

At step S3, an elastic reinforced film 6 is formed in the bending area A, wherein an elastic modulus of the elastic reinforced film 6 is smaller than an elastic modulus of the back film 5.

In an exemplary embodiment, the elastic reinforced film 6 may be formed of a light-curing adhesive, for example, generally formed of a UV light-curing adhesive material, and the production process thereof is simple and convenient.

The beneficial effects that can be achieved by the method for manufacturing a flexible substrate provided by the embodiments of the present disclosure are the same as the beneficial effects that can be achieved by the flexible substrate provided by the foregoing embodiments, and details are not described herein.

Figure 7:
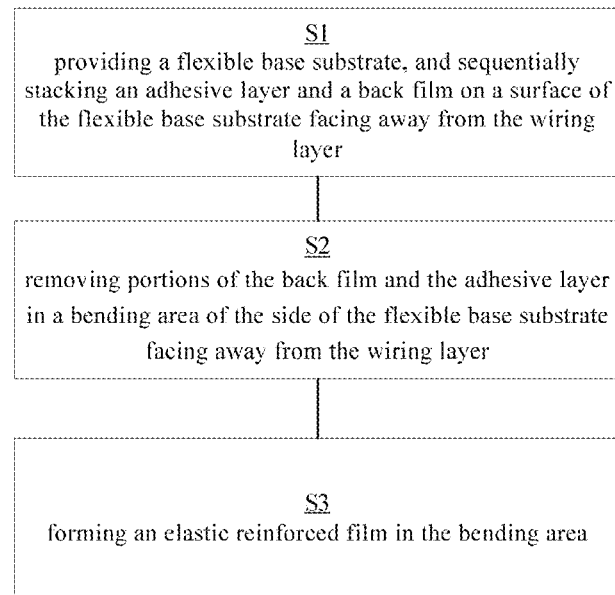
FIG. 7 is a flowchart of another method for manufacturing a flexible substrate according to an embodiment of the present disclosure.
Figure 8:
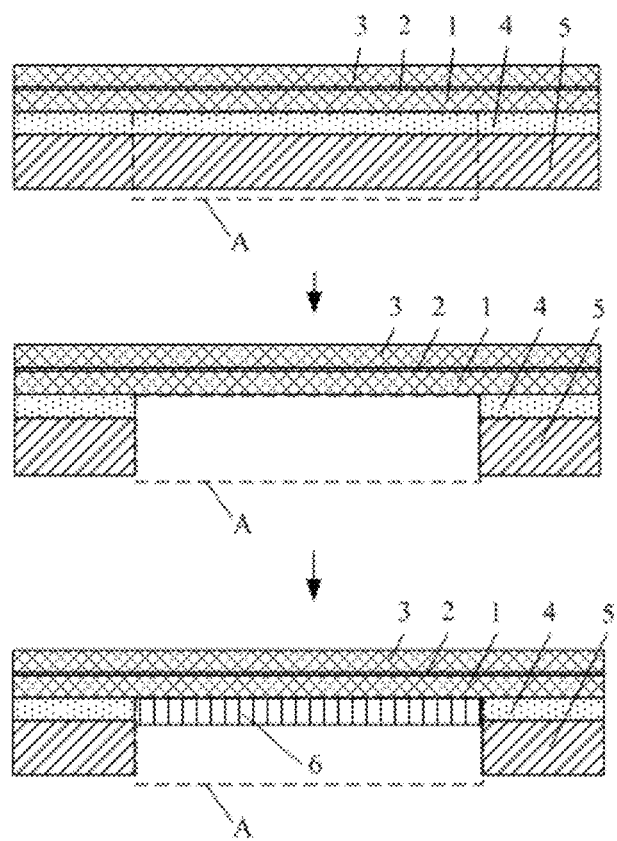

FIG. 7 and FIG. 8 illustrate a method for manufacturing a flexible substrate according to another embodiment of the present disclosure. Different from the embodiment shown in FIG. 6, in this embodiment, the back film 5 in the flexible substrate is adhered to the flexible base substrate 1 through an adhesive layer 4. Accordingly, at step S1, a flexible base substrate 1 is provided, and an adhesive layer 4 and a back film 5 are sequentially stacked on a surface of the flexible base substrate 1 facing away from the wiring layer 2. At step S2, portions of the back film 5 and the adhesive layer 4 in the bending area A are removed.

When using this method to fabricate a flexible substrate, the elastic modulus of the elastic reinforced film 6 should also be smaller than an elastic modulus of the adhesive layer 4, to ensure that the bending stress of the elastic reinforced film 6 due to bending is smaller after replacing the portion of the adhesive layer 4 in the bending area A with the elastic reinforced film 6, thereby further reducing the stress that the conductive wires in the wiring layer 2 need to share, so as to further reduce the risk of disconnection of the conductive wires in the wiring layer 2 when the flexible substrate is bent.

It should be noted that a manufacturing thickness of the elastic reinforced film 6 can be set according to actual needs. Particularly, compared with the flexible substrate shown in FIG. 1, in an embodiment according to the present disclosure, the thickness of the elastic reinforced film 6 may not exceed a sum of a thickness $d_2$ of the adhesive layer 4 and a thickness $d_1$ of the thinned back film 5. For example, assuming that the thickness $d_0$ of the back film 5 is 75 μm, the thickness $d_1$ of the thinned back film 5 is 5 μm, and the thickness $d_2$ of the adhesive layer 4 is 25 μm, then the thickness of the elastic reinforced film 6 is less than or equal to $d_1+d_2$. Of course, the thickness value of the elastic reinforced film 6 is not limited to this. For example, the thickness of the elastic reinforced film 6 is less than or equal to 30 μm±5 μm. Alternatively, the thickness of the elastic reinforced film 6 is less than or equal to the thickness of the adhesive layer 4. Alternatively, the thickness of the elastic reinforced film 6 is less than the thickness of the back film 5. Or alternatively, the thickness of the elastic reinforced film 6 is less than a sum of the thicknesses of the back film 5 and the adhesive layer 4, and the like.

In an exemplary embodiment, in the above-mentioned step S3, that is, the step of forming the elastic reinforced film 6 in the bending area A comprises: forming an elastic reinforced film 6 with a concave-convex surface in the bending area A, and the surface is a surface of the elastic reinforced film 6 facing away from the flexible base substrate 1. There may be various implementations of the morphology of the concave-convex surface of the elastic reinforced film 6, and a person skilled in the art may set it according to actual needs, such as the wavy surface shown in FIG. 5a and FIG. 5c, or the concave curved surface shown in FIG. 5b. Moreover, in an exemplary embodiment, a concave direction or a convex direction of the concave-convex shape on the surface of the elastic reinforced film 6 may be the same as or conformal with a bending direction of the flexible substrate.

The different morphologies of the surface of the elastic reinforced film 6 can be achieved by adjusting a coating size, times of coating and a curing time after the coating when forming the elastic reinforced film 6. In the manufacturing method provided in this embodiment, the elastic reinforced film 6 with a concave-convex surface is formed in the bending area A, which helps to improve the flexibility of the elastic reinforced film 6. When the flexible substrate is bent toward the back surface of the flexible substrate, the concave-convex surface of the elastic reinforced film 6 is used to further alleviate the stress on the conductive wires in the wiring layer 2 due to bending the elastic reinforced film 6, thereby more effectively reducing the risk of disconnection of the conductive wires in the wiring layer 2.

An embodiment of the present disclosure further provides a display device, which comprises the flexible substrate provided by the foregoing embodiments. The flexible substrate in the display device has the same beneficial effects as the flexible substrate in the above embodiment, and will not be repeated here.

The display device provided in the embodiments may be any product or component having a display function, such as a mobile phone, a tablet computer, a television, a display, a notebook computer, a digital photo frame, or a navigator.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

The invention claimed is:

1. A flexible substrate, comprising
a flexible base substrate, and
a wiring layer and a back film on opposite sides of the flexible base substrate respectively, wherein
a side of the flexible base substrate facing away from the wiring layer is provided with a flat area comprising the back film and a bending area from which the back film is removed, the bending area is provided with an elastic reinforced film,
an elastic modulus of the elastic reinforced film is smaller than an elastic modulus of the back film, and
the elastic reinforced film comprises a light-curing adhesive film.

2. The flexible substrate according to claim 1, wherein the back film in the flat area is in direct contact with a surface of the flexible base substrate facing away from the wiring layer.

3. The flexible substrate according to claim 1, wherein the back film in the flat area is adhered to the flexible base substrate through an adhesive layer.

4. The flexible substrate according to claim 3, wherein
the elastic reinforced film is in direct contact with a surface of the flexible base substrate facing away from the wiring layer, and
the elastic modulus of the elastic reinforced film is smaller than an elastic modulus of the adhesive layer.

5. The flexible substrate according to claim 3, wherein the elastic reinforced film is adhered to the flexible base substrate through the adhesive layer.

6. The flexible substrate according to claim 3, wherein the adhesive layer comprises a pressure-sensitive adhesive layer.

7. The flexible substrate according to claim 3, wherein a thickness of the elastic reinforced film satisfies one of the following conditions:
the thickness of the elastic reinforced film is less than or equal to 30 μm±5 μm;
the thickness of the elastic reinforced film is less than or equal to a thickness of the adhesive layer;
the thickness of the elastic reinforced film is less than a thickness of the back film; and
the thickness of the elastic reinforced film is less than a sum of the thickness of the back film and the thickness of the adhesive layer.

8. The flexible substrate according to claim 1, further comprising a flexible encapsulation layer on a side of the wiring layer facing away from the flexible base substrate.

9. The flexible substrate according to claim 1, wherein a surface of the elastic reinforced film facing away from the flexible base substrate comprises a concave-convex shape.

10. The flexible substrate according to claim 9, wherein a concave direction or a convex direction of the concave-convex shape on the surface of the elastic reinforced film facing away from the flexible base substrate is conformal with a bending direction of the flexible substrate.

11. The flexible substrate according to claim 9, wherein the surface of the elastic reinforced film facing away from the flexible base substrate is symmetrically arranged with a bending center of the bending area as a symmetrical center.

12. The flexible substrate according to claim 9, wherein a portion of the surface of the elastic reinforced film facing away from the flexible base substrate at a bending center of the bending area comprises a concave shape.

13. A display device comprising the flexible substrate according to claim 1.

14. A method for manufacturing a flexible substrate, comprising:
providing a flexible base substrate;
forming a wiring layer on a side of the flexible base substrate;
forming a back film on a side of the flexible base substrate facing away from the wiring layer;
removing a portion of the back film in a bending area of the side of the flexible base substrate facing away from the wiring layer; and
forming an elastic reinforced film in the bending area, and an elastic modulus of the elastic reinforced film being smaller than an elastic modulus of the back film, and the elastic reinforced film being made of a light-curing adhesive film.

15. The method for manufacturing a flexible substrate according to claim 14, wherein the removing a portion of the back film in a bending area of the side of the flexible base substrate facing away from the wiring layer comprises removing a portion of the back film in the bending area of the side of the flexible base substrate facing away from the wiring layer with laser light.

16. The method for manufacturing a flexible substrate according to claim 14, wherein
the forming a back film on a side of the flexible base substrate facing away from the wiring layer comprises:

sequentially stacking an adhesive layer and the back film on a surface of the flexible base substrate facing away from the wiring layer;

the removing a portion of the back film in a bending area of the side of the flexible base substrate facing away from the wiring layer comprises:

removing portions of the back film and the adhesive layer in the bending area together.

17. The method for manufacturing a flexible substrate according to claim 14, wherein the forming an elastic reinforced film in the bending area comprises:

making a surface of the formed elastic reinforced film facing away from the flexible base substrate comprise a concave-convex shape by adjusting a coating size, times of coating and a curing time after the coating of the light-curing adhesive.

18. The method for manufacturing a flexible substrate according to claim 16, wherein the adhesive layer is made of a pressure-sensitive adhesive.

19. The method of manufacturing a flexible substrate according to claim 14, further comprising forming a flexible encapsulation layer on a side of the wiring layer facing away from the flexible base substrate.

\* \* \* \* \*